(12) United States Patent
Ryu

(10) Patent No.: US 8,922,117 B2
(45) Date of Patent: Dec. 30, 2014

(54) ORGANIC LIGHT EMITTING DIODE DISPLAY AND MANUFACTURING METHOD THEREOF

(75) Inventor: Do-Hyung Ryu, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 146 days.

(21) Appl. No.: 13/197,878

(22) Filed: Aug. 4, 2011

(65) Prior Publication Data

US 2012/0133278 A1 May 31, 2012

(30) Foreign Application Priority Data

Nov. 29, 2010 (KR) ........................ 10-2010-0119888

(51) Int. Cl.
*H05B 33/06* (2006.01)
*H01L 51/52* (2006.01)
*H01L 27/32* (2006.01)
*H05B 33/04* (2006.01)

(52) U.S. Cl.
CPC .............. *H05B 33/04* (2013.01); *H01L 51/524* (2013.01); *H01L 27/3276* (2013.01); *H01L 51/5203* (2013.01)
USPC ............................................ 313/512; 313/46

(58) Field of Classification Search
CPC .............. H01L 27/3276; H01L 51/524; H01L 51/5203; H01L 51/5243; H01L 51/5246; H01L 51/5259; H05B 33/04; H05K 3/12

USPC ............................................... 313/45, 46, 512
See application file for complete search history.

(56) References Cited

U.S. PATENT DOCUMENTS

2001/0015618 A1 * 8/2001 Yamazaki et al. ............ 313/505

FOREIGN PATENT DOCUMENTS

| JP | 2005-183337 | 7/2005 |
|----|-------------|--------|
| KR | 10-0543131 | 1/2006 |
| KR | 10-2006-0089977 | 8/2006 |

* cited by examiner

*Primary Examiner* — Andrew Coughlin
(74) *Attorney, Agent, or Firm* — Robert E. Bushnell, Esq.

(57) ABSTRACT

An organic light emitting diode (OLED) display comprises: a substrate; a display formed on the substrate and including a common power line and a common electrode; a junction layer provided outside the display on the substrate; and a sealing substrate fixed to the substrate by the junction layer. The sealing substrate includes: a support film; a first metal layer provided on one side of the support film toward the substrate; a plurality of second metal layers provided on the first metal layer and being conductive with the first metal layer; and a third metal layer provided on the first metal layer and being insulated from the first metal layer. The second metal layers supply a first electric signal to the common power line, and the third metal layer supplies a second electric signal to the common electrode. A method of manufacturing such an OLED display is also disclosed.

17 Claims, 13 Drawing Sheets

ORGANIC LIGHT EMITTING DIODE DISPLAY AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on Nov. 29, 2010 and there duly assigned Serial No. 10-2010-0119888.

BACKGROUND OF THE INVENTION

1. Field of the Invention

The present invention generally relates to an organic light emitting diode (OLED) display. More particularly, the present invention relates to a sealing substrate for sealing a display and a method for manufacturing the sealing substrate.

2. Description of the Related Art

An organic light emitting diode (OLED) display, among display devices, is flat and emits it own light.

An organic light emitting diode (OLED) display is a self-light-emitting display which is provided with an organic light emitting diode which emits its own light to display an image. The function of the display unit, including a plurality of organic light emitting elements, may be deteriorated by penetration of external moisture and oxygen so that a technology for sealing the display unit in order to suppress the penetration of external moisture and oxygen is very important.

The above information disclosed in this Background section is only for enhancement of an understanding of the background of the described technology, and therefore it may contain information which does not form the prior art which is already known in this country to a person of ordinary skill in the art.

SUMMARY OF THE INVENTION

The present invention has been developed in an effort to provide an organic light emitting diode (OLED) display for increasing a sealing function of a display.

The present invention has also been developed in an effort to provide a method for manufacturing an organic light emitting diode (OLED) display for manufacturing a sealing substrate at low cost.

An exemplary embodiment of the present invention provides an organic light emitting diode (OLED) display comprising: a substrate; a display formed on the substrate, and including a common power line and a common electrode; a junction layer provided outside the display on the substrate; and a sealing substrate fixed to the substrate by the junction layer.

The sealing substrate includes: a support film; a first metal layer provided on one side of the support film toward the substrate; a plurality of second metal layers provided on the first metal layer while being conductive with the first metal layer, and supplying a first electric signal to the common power line; and a third metal layer provided on the first metal layer while being insulated from the first metal layer, and supplying a second electric signal to the common electrode.

The first metal layer is of the same size as the support film.

The sealing substrate further includes a plurality of conductive layers formed between the first metal layer and the second metal layers, and an insulation layer formed between the first metal layer and the third metal layer.

The conductive layers have the same thickness as the insulation layer, and are formed with a conductive tape or an anisotropic conductive film.

The second metal layers are separately provided with each other along an edge of the sealing substrate, and the third metal layer includes a middle unit facing the display and a plurality of extenders provided between the second metal layers on the edge of the sealing substrate.

The junction layer is a conductive junction layer, and the second metal layer and the extenders contact the conductive junction layer.

The conductive junction layer has conductivity in a thickness direction of the substrate, and has insulation in directions other than the thickness direction.

The organic light emitting diode display further includes a plurality of first pads which are provided outside the display on the substrate, and which are connected to the common power line.

The first pads contact the conductive junction layer and are electrically connected to the second metal layers through the conductive junction layer.

The organic light emitting diode display further includes a plurality of second pads which are provided outside the display on the substrate, and which are connected to the common electrode.

The second pads contact the conductive junction layer and are electrically connected to the extenders through the conductive junction layer.

The common power line includes a first common power line and a second common power line which cross each other.

The first pads and the second pads are provided on four edges of the substrate.

The first metal layer, the second metal layers, and the third metal layer are formed with a metal foil including copper or aluminum.

The second metal layers and the third metal layer form an anti-oxidizing film.

Another embodiment of the present invention provides a method for manufacturing an organic light emitting diode (OLED) display, the method comprising the steps of: (a) forming a first metal layer on a support film; (b) forming an insulation layer with a plurality of openings on the first metal layer; (c) forming a plurality of conductive layers on the first metal layer exposed by the openings; and (d) forming a plurality of second metal layers on the conductive layers, and forming a third metal layer on the insulation layer so as to manufacture a sealing substrate.

The support film is flexible, and sequentially undergoes steps (a) thru (d) while being transmitted in one direction by a first driving roll and a second driving roll.

The method includes the step of coating an adhesive on the support film, unwinding the first metal sheet from a spiral-wound roll, and stacking it on the support film.

The support film and the first metal sheet are cut after step (d), and the first metal sheet becomes the first metal layer.

In step (b), the insulation layer is screen-printed on the first metal layer by using a printer.

In step (c), the conductive layers are formed with a thickness the same as that of the insulation layer, and are formed with a conductive tape or an anisotropic conductive film.

Step (d) includes unwinding the second metal sheet from the spiral-wound roll so as to stack it on the insulation layer and the conductive layers, and blanking and forming the second metal sheet so as to divide the same into the second metal layers and the third metal layer.

Step (d) further comprises the step, after blanking and forming the second metal sheet, of applying heat and pressure to the second metal layers and the third metal layer by using a hot press device.

The organic light emitting diode (OLED) display, according to the exemplary embodiments, is a large display and increases luminance uniformity of the screen, and also simplifies the entire structure and the manufacturing process by reducing the number of the chip on films (COF) or flexible circuit boards (FPC) and the bonding process. The sealing substrate of the organic light emitting diode (OLED) display is manufactured according to the roll-to-roll sequential process so that it can be mass produced at low cost.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
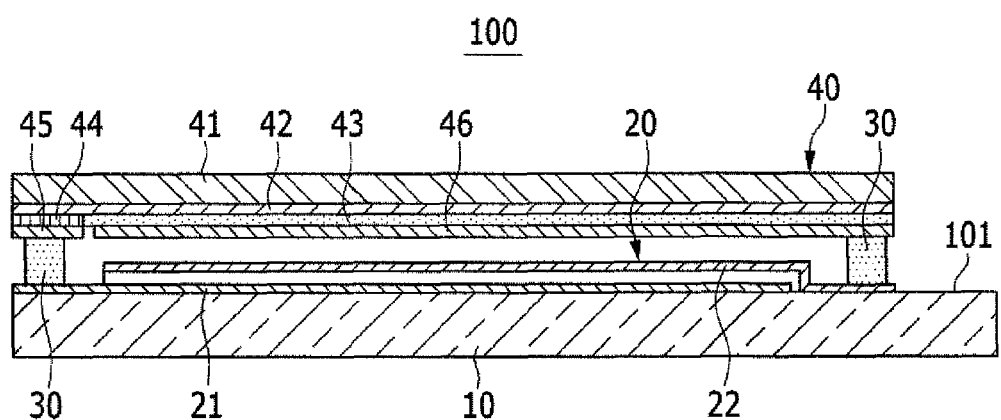
FIG. 1 is a cross-sectional view of an organic light emitting diode (OLED) display according to an exemplary embodiment of the present invention.

The present invention will be described more fully hereinafter with reference to the accompanying drawings, in which exemplary embodiments of the invention are shown. As those skilled in the art will realize, the described embodiments of the present invention may be modified in various different ways, all without departing from the spirit or scope of the present invention.

The drawings and description are to be regarded as illustrative in nature and not restrictive. Like reference numerals designate like elements throughout the specification. Furthermore, the size and thickness of the components shown in the drawings are optionally determined for a better understanding and ease of description, and the present invention is not limited to the examples shown in the drawings.

It will be understood that, when an element such as a layer, film, region, or substrate is referred to as being "on" another element, it can be directly on the other element or intervening elements may also be present. Throughout this specification and the claims that follow, when it is described that an element is "coupled" to another element, the element may be "directly coupled" to the other element or "electrically coupled" to the other element through a third element.

FIG. 1 is a cross-sectional view of an organic light emitting diode (OLED) display according to an exemplary embodiment of the present invention.

Referring to FIG. 1, the organic light emitting diode (OLED) display 100 includes a substrate 10, a display 20 formed on the substrate 10, a conductive junction layer 30 surrounding the display 20, and a sealing substrate 40 fixed to the substrate 10 by the conductive junction layer 30.

The display 20 includes a plurality of pixels, each of which includes an organic light emitting element and a driving circuit. The organic light emitting element includes a pixel electrode, an organic emission layer, and a common electrode 22. The driving circuit includes at least two thin film transistors, including a switching thin film transistor and a thin film transistor, and at least one capacitor.

A gate line, a data line, and common power line 21 are positioned on each pixel. The gate line transmits a scan signal and the data line transmits a data signal. The common power line 21 applies a common voltage to a driving thin film transistor. The common power line 21 includes a first common power line and a second common power line which are in parallel with the data line or cross the same.

A detailed description of the display unit 20 will be given later, and FIG. 1 schematically illustrates the display unit 20 where the common power line 21 and the common electrode 22 are formed.

The substrate 10 is made of transparent glass or transparent plastic, and the light emitted from the display 20 is discharged to the outside through the substrate 10. A pad region 101 is provided on an edge of the substrate 10 outside the conductive junction layer 30. Pad electrodes connected to various electrodes and lines are provided in the pad region 101 configuring the display 20, and a chip on film (COF) or a flexible printed circuit (FPC) is attached over the pad electrodes so as to apply electric signals to the pad electrodes.

The conductive junction layer 30 is formed with an ultraviolet (UV) setting resin or thermosetting resin including a conductive component. In the case of the thermosetting resin, the conductive junction layer 30 may include an epoxy resin. FIG. 1 shows the case in which one conductive junction layer 30 is provided outside the display 20, and an insulating junction layer can be formed inside, outside or at both sides of the conductive junction layer 30.

Inside the conductive junction layer 30, a hygroscopic filler (not shown) may be provided between the substrate 10 and the sealing substrate 40, and a getter (not shown) may be provided between the display 20 and the conductive junction layer 30.

Figure 2:
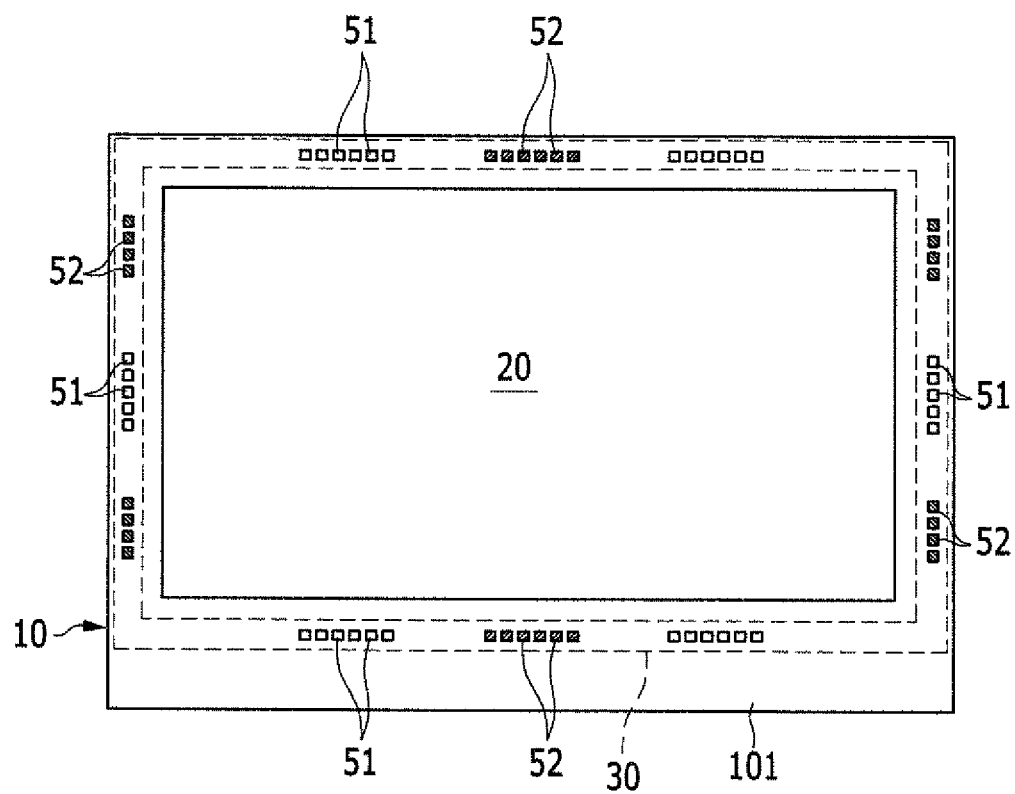
FIG. 2 is a top plan view of a substrate in an organic light emitting diode (OLED) display shown in FIG. 1.

FIG. 2 is a top plan view of a substrate in an organic light emitting diode (OLED) display shown in FIG. 1.

Referring to FIG. 1 and FIG. 2, a first pad 51 and a second pad 52 are provided outside the display 20. The first pad 51 is connected to the common power line 21 of the display 20, and the second pad 52 is connected to the common electrode 22 of the display 20. The first pad 51 and the second pad 52 are formed on both a long side and a short side of the substrate 10, and they can be alternately disposed in one direction of the substrate 10. In FIG. 2, the second pad 52 is shown as a dot pattern so as to distinguish it from the first pad 51.

The first pad 51 on the long side of the substrate 10, from among a plurality of first pads 51, is connected to the first common power line, and the first pad 51 on the short side of the substrate 10 is connected to the second common power line. The first pad 51 and the second pad 52 shown in FIG. 2 are one example, and their positions and number are not restricted to the example.

The first pad 51 and the second pad 52 are formed at positions corresponding to the conductive junction layer 30. In this instance, the conductive junction layer 30 shows conductivity in a thickness direction of the substrate 10 (vertical direction with respect to FIG. 1), and shows no conductivity in other directions. Therefore, when one conductive junction layer 30 contacts the first pad 51 and the second pad 52, the first pad 51 and the second pad 52 are not short-circuited with each other.

Figure 3:
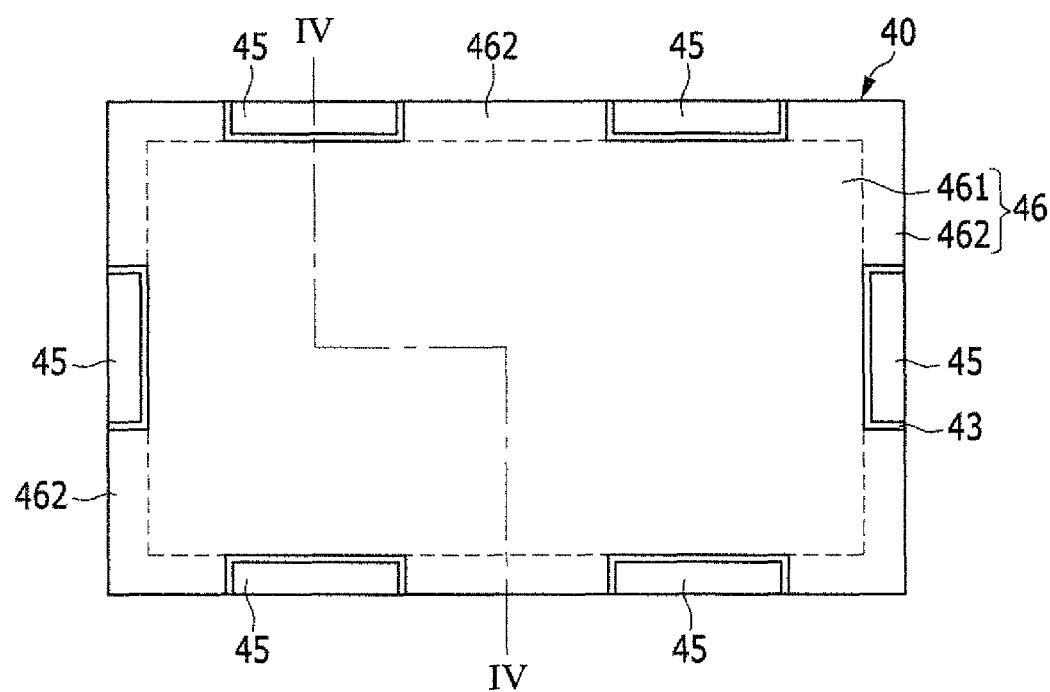
FIG. 3 is a top plan view of an inner side of a sealing substrate in an organic light emitting diode (OLED) display shown in FIG. 1.
Figure 4:
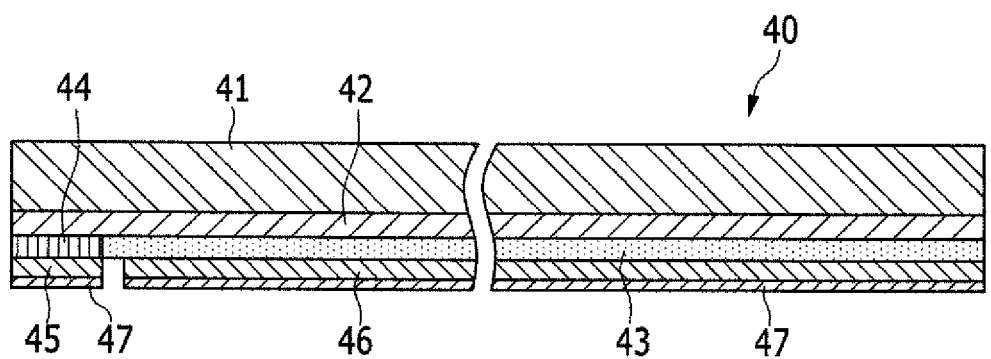
FIG. 4 is a cross-sectional view of a sealing substrate taken along a line IV-IV of FIG. 3.

FIG. 3 is a top plan view of an inner side of a sealing substrate in an organic light emitting diode (OLED) display shown in FIG. 1, and FIG. 4 is a cross-sectional view of a sealing substrate taken along line IV-IV of FIG. 3. FIG. 1 also shows a form which is cut with respect to the line IV-IV of FIG. 3.

Referring to FIG. 1 thru FIG. 4, the sealing substrate 40 is formed so as to cover the other regions of the substrate 10 excluding the pad region 101. The sealing substrate 40 includes a support film 41, a first metal layer 42, an insulation layer 43, a conductive layer 44, a second metal layer 45, and a third metal layer 46.

The organic light emitting diode (OLED) display 100 uses the first metal layer 42, the conductive layer 44, and the second metal layer 45 to supply a first electric signal to the common power line 21, and uses the third metal layer 46 to supply a second electric signal to the common electrode 22. Therefore, the common power line 21 and the common electrode 22 are not connected to the COF or the FPC attached to the pad region 101, and receive the corresponding electric signal from the sealing substrate 40.

The support film 41 is formed with a polymer resin, and is formed so as to be thicker than the first metal layer 42, the insulation layer 43, the second metal layer 45, and the third metal layer 46. The support film 41 may include a polymer resin having an internal temperature which is greater than a hardening temperature of the conductive junction layer 30, for example, a polyimide (PI) or polyethylene terephthalate (PET).

The first metal layer 42 is formed on the entire side of the support film 41 toward the substrate 10. The first metal layer 42 includes copper or aluminum, and it can be formed with a metal foil including copper or aluminum. The first metal layer 42 has a very low electrical resistance and substantially blocks moisture and oxygen.

The insulation layer 43 is formed on one side of the first metal layer 42 toward the substrate 10 and covers the first metal layer 42.

Figure 5:
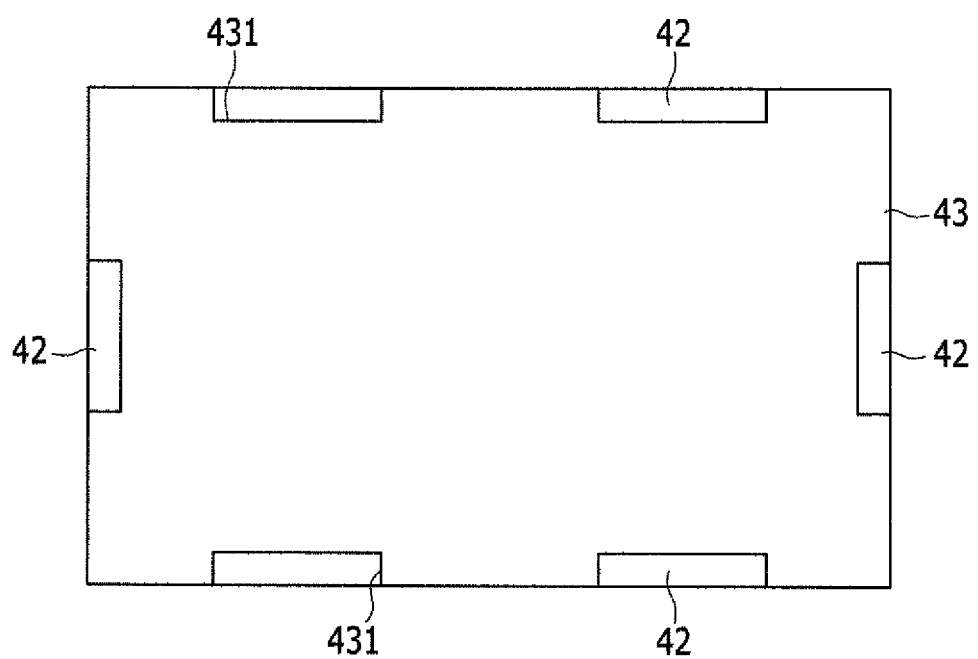
FIG. 5 is a top plan view of an inner side of an insulation layer of a sealing substrate shown in FIG. 4.

FIG. 5 is a top plan view of an inner side of an insulation layer of a sealing substrate shown in FIG. 4. Referring to FIG. 5, the insulation layer 43 has a plurality of openings 431 for exposing the first metal layer 42 on the edge. In this instance, the positions of the respective openings 431 correspond to that of the first pad 51 shown in FIG. 2.

Referring again to FIG. 1 thru FIG. 4, a conductive layer 44 is provided over the first metal layer 42 for each opening 431 of the insulation layer 43, and a second metal layer 45 is provided over the conductive layer 44. Therefore, the second metal layers 45 are electrically connected to the first metal layer 42 through the conductive layer 44. The conductive layer 44 has the same thickness as the insulation layer 43, and is formed as a conductive tape generated by coating a conductive adhesive agent on both sides of the metal foil, or is formed as an anisotropic conductive film including conductive balls.

A third metal layer 46 is formed separately from the second metal layers 45 on the insulation layer 43. The third metal layer 46 is formed on the insulation layer 43 except for a part which maintains a distance from the second metal layers 45 in the middle of the insulation layer 43. The third metal layer 46 includes a middle unit 461 (FIG. 3) provided in the middle of the sealing substrate 40, and a plurality of extenders 462 provided between the second metal layers 45 on the edge of the sealing substrate 40.

The second metal layers 45 and the third metal layer 46 can be made of the same material as the first metal layer 42. For example, the second metal layers 45 and the third metal layer 46 can be formed of a metal foil including copper or aluminum. In this instance, since the second metal layers 45 and the third metal layer 46 are exposed to the air while the sealing substrate 40 is manufactured, an anti-oxidizing film 47 (refer to FIG. 4) can be formed on the surface thereof. The anti-oxidizing film 47 can be formed with a tin plated layer or a nickel plated layer.

The second metal layers 45 and the third metal layer 46 have very low electrical resistance, and block moisture and oxygen in an excellent manner. Therefore, the moisture and the oxygen outside the organic light emitting diode (OLED) display 100 are initially blocked by the first metal layer 42, and then by the second metal layers 45 and the third metal layer 46. The sealing substrate 40 has metal layers disposed in a dual manner so that the sealing function of the display 20 is increased, resulting in suppression of deterioration of the display 20 and increase in its life-span.

The second metal layers 45 face the first pads 51 in the thickness direction of the substrate 10, and the extenders 462 of the third metal layer 46 face the second pads 52 in the thickness direction of the substrate 10. The conductive junction layer 30 is provided between the second metal layers 45 and the first pad 51 so as to electrically connect the second metal layers 45 and the first pad 51, and the same is provided between the extenders 462 of the third metal layer 46 and the second pad 52 so as to electrically connect the third metal layer 46 and the second pad 52.

An external access terminal (not shown) is connected to one of a plurality of second metal layers 45 and one of the extenders 462. The first electric signal applied to the second metal layer 45 by the external access terminal is supplied to the common power line 21 of the display 20 through the conductive junction layer 30 and the first pad 51, and the second electric signal applied to the extender 462 of the third metal layer 46 is supplied to the common electrode 22 of the display 20 through the conductive junction layer 30 and the second pad 52.

In this instance, since the second metal layers 45 are electrically connected to each other by the conductive layer 44 and the first metal layer 42, the first electric signal is shared by all second metal layers 45 when the external access terminal is connected to one of the second metal layers 45. The third metal layer 46 is formed as a single layer so that the second electric signal is shared by all extenders 462.

Therefore, the first electric signal and the second electric signal can be uniformly applied to a plurality of first pads 51 and a plurality of second pads 52 provided at four edges of the substrate 10. As a result, the organic light emitting diode (OLED) display 100 realizes a wide display and improved luminance uniformity.

Also, the width of the second metal layer 45, allowable when the wide organic light emitting diode (OLED) display 100 is manufactured, is substantially 2 mm. The second metal layer 45 cannot supply current capacity which is greater than 20 A because of high wiring resistance when it is not connected to the first metal layer 42. However, since the first metal layer 42, having the same area as the support film 41, is connected to a plurality of the second metal layers 45 in the organic light emitting diode (OLED) display 100, wiring resistance of the second metal layer 45 is reduced and current capacity greater than 20 A is supplied.

The metal layers 42, 45 and 46, provided on the sealing substrate 40, have a sealing function for blocking permeation of the moisture and oxygen to the display 20, and a wiring function for supplying the first electric signal and the second electric signal. Since the luminance uniformity of the screen is deteriorated when the large display 20 is realized, the electric signal is supplied by forming a pad region 101 on the four edges of the substrate 10, and using the COF or the FPC attached to the pad region 101.

However, the organic light emitting diode (OLED) display 100 can uniformly supply the corresponding electric signal to the common power line 21 and the common electrode 22 without forming the pad region 101 on the four edges of the substrate 10. Therefore, the entire configuration and the manufacturing process of the organic light emitting diode (OLED) display 100 can be simplified by reducing the number of the COF's and the FPC's and the bonding process.

Figure 6:
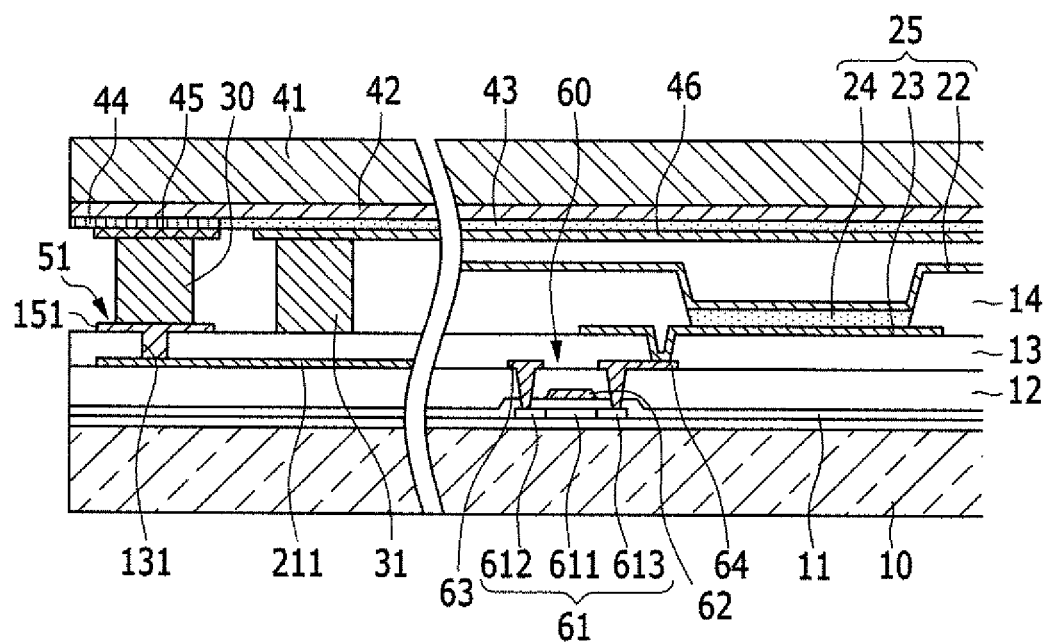
FIG. 6 thru FIG. 8 are partially magnified cross-sectional views of an organic light emitting diode (OLED) display shown in FIG. 1.
Figure 7:
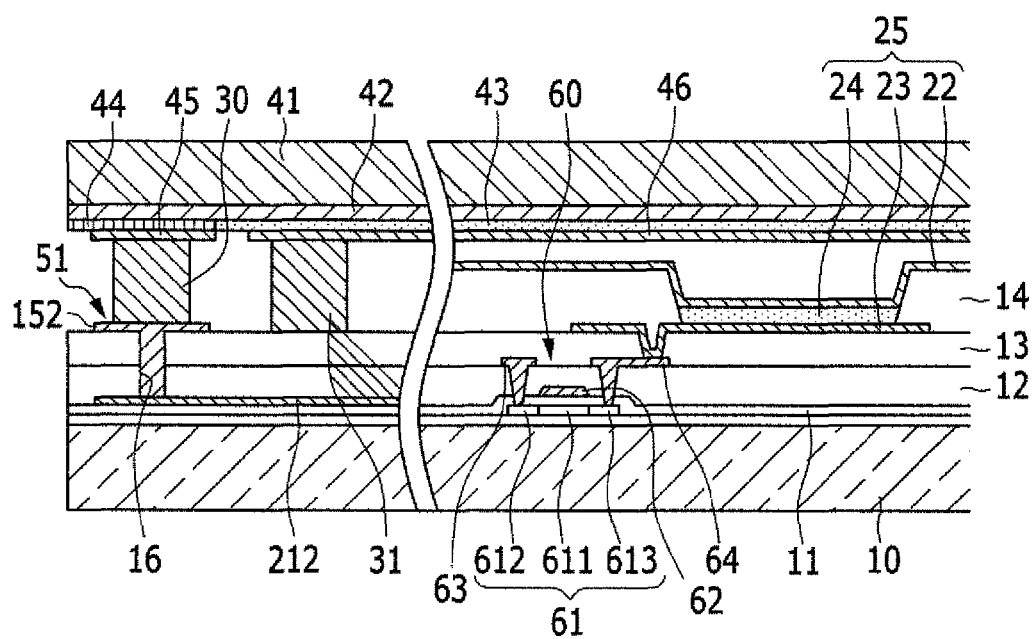
Figure 8:
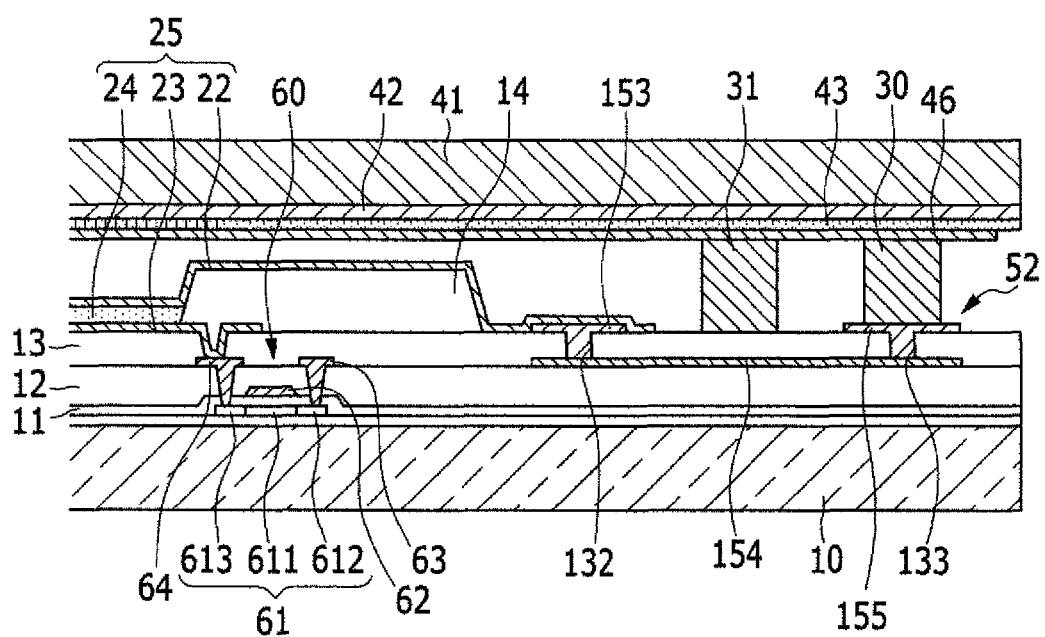
Figure 9A:
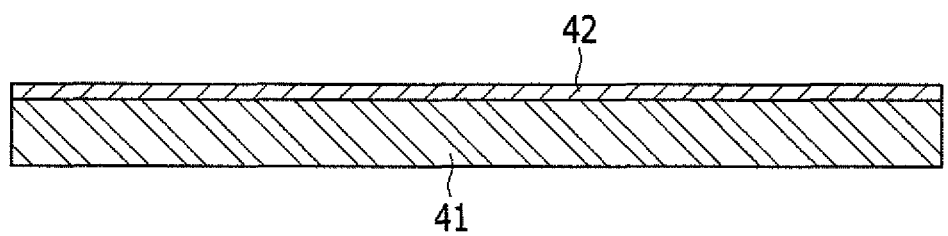
FIG. 9A thru FIG. 9D are cross-sectional views of a sealing substrate for showing a process for manufacturing a sealing substrate according to an exemplary embodiment of the present invention.
Figure 9B:
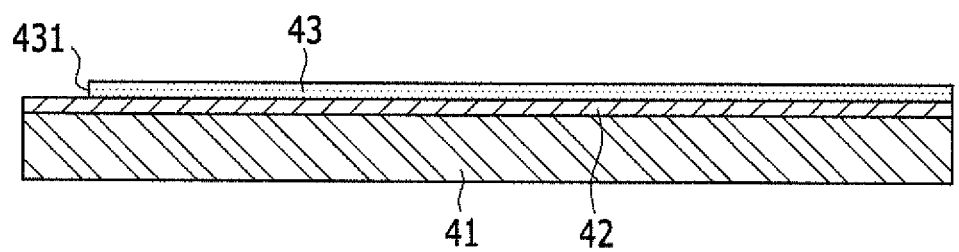
Figure 9C:
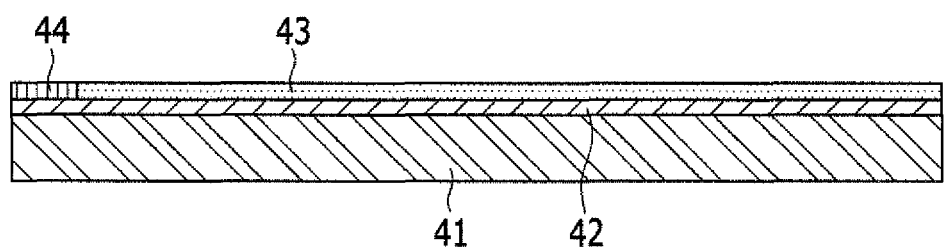
Figure 9D:
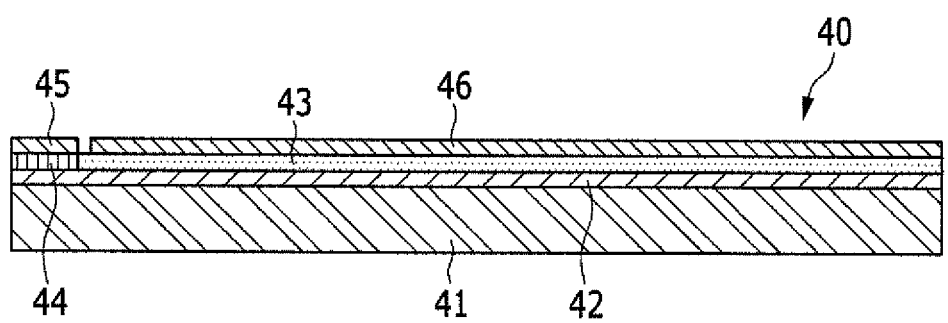

FIG. 6 thru FIG. 8 are partially magnified cross-sectional views of an organic light emitting diode (OLED) display shown in FIG. 1.

FIG. 6 shows a first common power line 211 and a first pad 51 in detail, and FIG. 7 shows a second common power line 212 and a first pad 51 in detail. FIG. 8 shows a common electrode 22 and a second pad 52 in detail. FIG. 6 thru FIG. 8 exemplify the case in which an insulating junction layer 31 is provided between the display and the conductive junction layer 30.

Referring to FIG. 6 thru FIG. 8, an organic light emitting element 25 and a driving circuit are formed for each pixel in the display. The driving circuit includes at least two thin film transistors and at least one capacitor. FIG. 6 thru FIG. 8 show that a thin film transistor 60 and an organic light emitting element 25 are provided in the display. The organic light emitting element 25 and the thin film transistor 60 are not restricted to the example shown, and are variable in many ways.

The thin film transistor 60 includes a semiconductor layer 61, a gate electrode 62, a source electrode 63, and a drain electrode 64. The semiconductor layer 61 is formed of a polysilicon layer and includes a channel region 611, a source region 612, and a drain region 613. The channel region 611 is an impurity-non-doped intrinsic semiconductor, and the source region 612 and the drain region 613 are impurity-doped impurity semiconductors.

The gate electrode 62 is provided in the channel region 611 of the semiconductor layer 61 with a gate insulating layer 11 disposed therebetween. The source electrode 63 and the drain electrode 64 are provided on the gate electrode 62 with an interlayer insulating layer 12 disposed therebetween, and are respectively connected to the source region 612 and the drain region 613 through a contact hole formed in the interlayer insulating layer 12. A planarization layer 13 is formed on the source electrode 63 and the drain electrode 64, and a pixel electrode 23 is provided on the planarization layer 13. The pixel electrode 23 is connected to the drain electrode 64 through the contact hole of the planarization layer 13.

A pixel defining layer 14 is formed on the pixel electrode 23 and the planarization layer 13. The pixel defining layer 14 forms an opening for each pixel so as to expose a part of the pixel electrode 23. An organic emission layer 24 is formed on the exposed pixel electrode 23, and a common electrode 22 is formed over the display so as to cover the organic emission layer 24 and the pixel defining layer 14. The pixel electrode 23, the organic emission layer 24, and the common electrode 22 form an organic light emitting element 25.

The pixel electrode 23 can be a hole injection electrode, and the common electrode 22 can be an electron injecting electrode. In this case, the organic emission layer 24 includes a hole injection layer (HIL), a hole transport layer (HTL), an emission layer, an electron transport layer (ETL), and an electron injection layer (EIL) sequentially stacked from the pixel electrode 23. When holes and electrons are injected into the organic emission layer 24 from the pixel electrode 23 and the common electrode 22, and when excitons, which are a combination of the injected holes and electrons, are changed to the ground state from the exited state, light is emitted.

The pixel electrode 23 is formed of a permissive conductive layer, and the common electrode 22 is formed of a reflective conductive layer. The light outputted by the organic emission layer 24 is reflected by the common electrode 22 and is outputted to the outside through the pixel electrode 23 and the substrate 10. The above-noted light emitting structure is called a rear light emission structure. The pixel electrode 23 can be formed with three layers of indium tin oxide (ITO)/silver (Ag)/ITO, and the common electrode 22 can include silver (Ag), aluminum (Al), a silver alloy or an aluminum alloy.

The first common power line 211 and the second common power line 212 can be formed on the same layer as the gate electrode 62 or the source/drain electrodes 63 and 64. FIG. 6 shows that the first common power line 211 is formed on the same layer as the source/drain electrodes 63 and 64 with the same material, and FIG. 7 shows that the second common power line 212 is formed on the same layer as the gate electrode 62 with the same material.

Referring to FIG. 6 and FIG. 7, ends of the first common power line 211 and the second common power line 212 are extended outside the display. At least one of the four insulation layers formed on the display can be extended outside the display. For example, the end of the first common power line 211 is covered by the planarization layer 13, and the end of the second common power line 212 is covered by the interlayer insulating layer 12 and the planarization layer 13.

The planarization layer 13 has a first opening 131 so as to expose the end of the first common power line 211, and a first pad conductive layer 151 is formed on the planarization layer 13 and is connected to the first common power line 211 through the first opening 131. The first pad 51, provided on the long side of the substrate 10, can be defined to be a first pad conductive layer 151.

The interlayer insulating layer 12 and the planarization layer 13 have a second opening 16 so as to expose an end of the second common power line 212, and a second pad conductive layer 152 is formed on the planarization layer 13 and is connected to the second common power line 212 through the second opening 16. The first pad 51, provided on the short side of the substrate 10, can be defined to be a second pad conductive layer 152. The first pad conductive layer 151 and the second pad conductive layer 152 can be formed on the same layer as the pixel electrode 23 with the same material.

Referring to FIG. 8, the common electrode 22 is provided inside the insulating junction layer 31, and the second pad 52 is formed over the inside and the outside of the insulating junction layer 31 so as to electrically connect the common electrode 22 and the conductive junction layer 30. The second pad 52 includes a third pad conductive layer 153, a fourth pad conductive layer 154, and a fifth pad conductive layer 155.

The third pad conductive layer 153 is provided inside the insulating junction layer 31 and contacts the common electrode 22. The fourth pad conductive layer 154 is connected to the third pad conductive layer 153 through the third opening 132 of the planarization layer 13, and is provided over the inside and the outside of the insulating junction layer 31. The fifth pad conductive layer 155 is provided between the conductive junction layer 30 and the planarization layer 13, and is connected to the fourth pad conductive layer 154 through the fourth opening 133 of the planarization layer 13.

The third pad conductive layer 153 and the fifth pad conductive layer 155 can be formed on the same layer as the pixel electrode 23 and with the same material. The fourth pad conductive layer 154 can be formed on the same layer as the gate electrode 62 or the source/drain electrodes 63 and 64 and with the same material. FIG. 8 exemplifies the case in which the fourth pad conductive layer 154 is formed on the same layer as the source/drain electrodes 63 and 64. The detailed configuration of the second pad 52 is not restricted to the above description, and any configurations for electrically connecting the common electrode 22 of the display and the conductive junction layer 30 are applicable.

Next, a method for manufacturing a sealing substrate 40 will be described.

FIG. 9A thru FIG. 9D are cross-sectional views of a sealing substrate for showing a process for manufacturing a sealing substrate according to an exemplary embodiment of the present invention.

Referring to FIG. 9A thru FIG. 9D, the method for manufacturing the sealing substrate 40 includes providing a support film 41 and forming a first metal layer 42 on the support film 41 (the first stage), forming an insulation layer 43 having a plurality of openings 431 on the first metal layer 42 (the second stage), forming a conductive layer 44 on the first metal layer 42 exposed by the openings 431 (the third stage), and forming second metal layers 45 on the conductive layer 44 and forming a third metal layer 46 separated from the second metal layers 45 on the insulation layer 43 (the fourth stage.)

In the first stage, the support film 41 may be controlled in advance according to the size of the sealing substrate 40. The first metal layer 42, the insulation layer 43, the conductive layer 44, the second metal layers 45, and the third metal layer 46 are sequentially stacked on the support film 41. The insulation layer 43 can be formed by screen printing, and the conductive layer 44 can be formed by a conductive tape or an anisotropic conductive film. The second metal layers 45 and the third metal layer 46 can be formed by disposing a single metal layer on the insulation layer 43 and the conductive layer 44, and blanking and forming the same.

In addition, the support film 41 is flexible so that the sealing substrate 40 can be manufactured by using the roll-to-roll sequential process.

Figure 10:
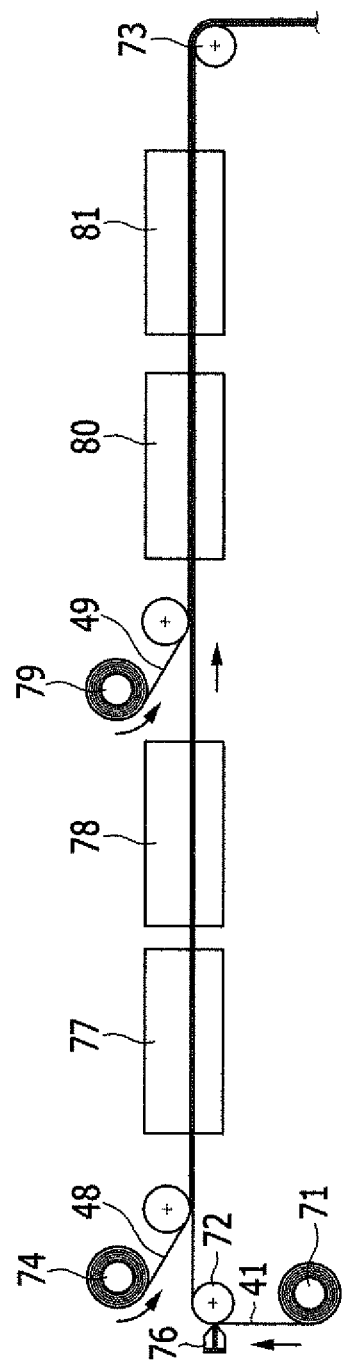
FIG. 10 is a schematic diagram of a process for manufacturing a sealing substrate to which the roll-to-roll process is applied.

FIG. 10 is a schematic diagram of a process for manufacturing a sealing substrate 40 to which the roll-to-roll process is applied.

Referring to FIG. 10, the support film 41 is provided to the manufacturing system while it is wound on a first spiral-wound roll 71. The support film 41, unwound from the first spiral-wound roll 71, is transmitted in one direction by a first driving roll 72 and a second driving roll 73, and sequentially passes through the described first to fourth stages. The support film 41 may include a polyimide (PI) or polyethylene terephthalate (PET).

The first stage includes unwinding a first metal sheet 48 from a second spiral-wound roll 74 and stacking the same on the support film 41. The first metal sheet 48 may be metal foil, including copper or aluminum. Before the first metal sheet 48 is stacked on the support film 41, an adhesive is coated on the support film 41 by using a nozzle 76. The stacked support film 41 and the first metal sheet 48 are firmly bonded while passing through a hardening device using hot air (not shown).

The second stage includes inputting the support film 41 and the first metal sheet 48 to a printer 77, and screen-printing the insulation layer 43 on the first metal sheet 48. In this instance, as shown in FIG. 5, the insulation layer 43 has a plurality of openings 431 on the edge thereof so as to partially expose the first metal sheet 48.

The third stage includes attaching the conductive layer 44 to the first metal sheet 48 exposed by the opening 431 of the insulation layer 43 by inputting a stacked structure, including the support film 41, the first metal sheet 48, and the insulation layer 43, into a conductive layer attacher 78. The conductive layer 44 may be a conductive tape generated by coating a conductive adhesive agent on both sides of the metal foil, or an anisotropic conductive film including conductive balls. The conductive layer 44 may have the same thickness as the insulation layer 43.

The fourth stage includes unwinding a second metal sheet 49 from a third spiral-wound roll 79 and stacking it on the top side of the stacked structure, that is, the entire top part of the insulation layer 43 and a plurality of conductive layers 44, and inputting the stacked structure in a former 80 so as to blank and form the second metal sheet 49.

As shown in FIG. 3, the second metal sheet 49 is divided into a plurality of second metal layers 45 and a third metal layer 46 by the blanking and forming process. That is, an outer part of the second metal layers 45, from among the second metal sheet 49, is removed by a predetermined thickness, and the second metal sheet 49 is divided into the second metal layers 45 and the third metal layer 46. In this instance, the second metal layers 45 are electrically connected to each other by the conductive layer 44 and the first metal sheet 48.

The second metal sheet 49 may be metal foil including copper or aluminum. The second metal sheet 49 can be easily oxidized since it is exposed to the air before the completed sealing substrate 40 is bonded to the substrate. Therefore, the second metal sheet 49 can have an anti-oxidizing film, such as a tin plated layer or a nickel plated layer, on the surface thereof.

The stacked structure, having undergone the fourth stage, is inputted to a hot press device 81 and is pressurized at a predetermined temperature. Hence, the second metal layers 45 and the third metal layer 46 are bonded to the conductive layer 44 and the insulation layer 43, respectively. The stacked structure is inputted to a cutter (not shown), and is divided into an individual sealing substrate 40, and the first metal sheet 48 is made into the first metal layer 42.

Accordingly, the sealing substrate 40 can be mass produced at a low cost since it is manufactured by the roll-to-roll sequential process. That is, the product cost can be reduced by excluding the expensive process since the first metal layer 42 and the second metal layers 45 can be made conductive without patterning the via hole, while an etching process or a plating process for forming wires is not included.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:

a substrate;
a display provided on the substrate and including a common power line and a common electrode;
a junction layer provided outside the display on the substrate; and
a sealing substrate fixed to the substrate by the junction layer, the sealing substrate including:
a support film;
a first metal layer provided on one side of the support film toward the substrate;
a plurality of second metal layers provided directly on, and in direct contact with, the first metal layer and being conductive with the first metal layer, and supplying a first electric signal to the common power line; and
a third metal layer provided on the first metal layer and being insulated from the first metal layer, and supplying a second electric signal to the common electrode;
wherein the first metal layer, the second metal layers and the third metal layer are provided on the one side of the support film.

2. The organic light emitting diode display device of claim 1, wherein the first metal layer has a same size as the support film.

3. The organic light emitting diode display device of claim 1, wherein the sealing substrate includes a plurality of conductive layers provided between the first metal layer and the second metal layers, and an insulation layer provided between the first metal layer and the third metal layer.

4. The organic light emitting diode display device of claim 3, wherein the conductive layers have a same thickness as the insulation layer, and are formed of one of a conductive tape and an anisotropic conductive film.

5. The organic light emitting diode display device of claim 1, wherein the second metal layers are separately provided with each other along an edge of the sealing substrate, and the third metal layer includes a middle unit facing the display and a plurality of extenders provided between the second metal layers on the edge of the sealing substrate.

6. The organic light emitting diode display device of claim 5, wherein the junction layer is a conductive junction layer, and the second metal layer and the extenders contact the conductive junction layer.

7. The organic light emitting diode display device of claim 6, wherein the conductive junction layer shows conductivity in a thickness direction of the substrate, and shows insulation in directions other than the thickness direction.

8. The organic light emitting diode display device of claim 6, further comprising a plurality of first pads provided outside the display on the substrate and connected to the common power line, wherein the first pads contact the conductive junction layer and are electrically connected to the second metal layers through the conductive junction layer.

9. The organic light emitting diode display device of claim 8, further comprising a plurality of second pads provided outside the display on the substrate and connected to the common electrode, wherein the second pads contact the conductive junction layer and are electrically connected to the extenders through the conductive junction layer.

10. The organic light emitting diode display device of claim 1, wherein the first metal layer, the second metal layers, and the third metal layer are formed of a metal foil including one of copper and aluminum.

11. The organic light emitting diode display device of claim 10, wherein the second metal layers and the third metal layer form an anti-oxidizing film.

12. An organic light emitting diode display device, comprising:
a substrate;
a display provided on the substrate and including a common power line and a common electrode;
a junction layer provided outside the display on the substrate; and
a sealing substrate fixed to the substrate by the junction layer, the sealing substrate including:
a support film;
a first metal layer provided on one side of the support film toward the substrate;
a plurality of second metal layers provided on the first metal layer and being conductive with the first metal layer, and supplying a first electric signal to the common power line; and
a third metal layer provided on the first metal layer and being insulated from the first metal layer, and supplying a second electric signal to the common electrode;
wherein the first metal layer, the second metal layers and the third metal layer are provided on the one side of the support film;
wherein the common power line includes a first common power line and a second common power line crossing each other, and wherein first pads and second pads are provided on four edges of the substrate.

13. An organic light emitting diode (OLED) display device, comprising:
a substrate;
a display provided on the substrate and including a common power line and a common electrode;
a junction layer provided outside the display on the substrate; and
a sealing substrate fixed to the substrate by the junction layer, the sealing substrate including:
a support film;
a first metal layer provided on one side of the support film toward the substrate;
a plurality of second metal layers provided on the first metal layer and being conductive with the first metal layer, and supplying a first electric signal to the common power line; and
a third metal layer provided on the first metal layer and being insulated from the first metal layer, and supplying a second electric signal to the common electrode;
said device further comprising a plurality of first pads provided outside the display on the substrate and connected to the common power line, and a plurality of second pads provided outside the display on the substrate and connected to the common electrode;
wherein the common power line includes a first common power line and a second common power line crossing each other, and the first pads and the second pads are provided on four edges of the substrate.

14. The organic light emitting diode display device of claim 13, wherein the first pads contact the junction layer and are electrically connected to the second metal layers through the junction layer.

15. The organic light emitting diode display device of claim 13, wherein the second pads contact the junction layer and are electrically connected to extenders through the junction layer.

16. The organic light emitting diode display device of claim 13, wherein the second metal layers are separately provided with each other along an edge of the sealing substrate, and the third metal layer includes a middle unit facing the display and a plurality of extenders provided between the second metal layers on the edge of the sealing substrate.

17. The organic light emitting diode display device of claim 16, wherein the junction layer is a conductive junction layer, and the second metal layer and the extenders contact the conductive junction layer.

* * * * *